(12) United States Patent
Shin et al.

(10) Patent No.: US 11,942,028 B2
(45) Date of Patent: *Mar. 26, 2024

(54) DISPLAY DEVICE

(71) Applicant: Samsung Display Co., LTD., Yongin-si (KR)

(72) Inventors: Dong Hee Shin, Asan-si (KR); Sun Kwun Son, Suwon-si (KR); Na Hyeon Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/097,064

(22) Filed: Jan. 13, 2023

(65) Prior Publication Data

US 2023/0178005 A1 Jun. 8, 2023

Related U.S. Application Data

(63) Continuation of application No. 17/365,414, filed on Jul. 1, 2021, now Pat. No. 11,557,245.

(30) Foreign Application Priority Data

Feb. 4, 2022 (JP) .................................. 2022-016698

(51) Int. Cl.
*G09G 3/32* (2016.01)
*G09G 3/00* (2006.01)

(52) U.S. Cl.
CPC .............. *G09G 3/32* (2013.01); *G09G 3/006* (2013.01); *G09G 2300/0408* (2013.01); *G09G 2300/0426* (2013.01); *G09G 2310/0278* (2013.01); *G09G 2330/028* (2013.01)

(58) Field of Classification Search
CPC ........... G09G 3/006; G09G 3/32–3291; G09G 2300/02; G09G 2300/026; G09G 2300/0404; G09G 2300/0408; G09G 2300/0421–043; G09G 2300/0439; G09G 2300/0465; G09G 2310/0264–0278; G09G 2320/029; G09G 2320/0693; G09G 2330/028; G09G 2330/10; G09G 2330/12
See application file for complete search history.

(56) References Cited

U.S. PATENT DOCUMENTS

| | | | |
|---|---|---|---|
| 9,542,901 B2 | 1/2017 | Kim et al. | |
| 2005/0078104 A1* | 4/2005 | Matthies | H10K 50/86 345/204 |
| 2005/0088198 A1 | 4/2005 | Nakano et al. | |

(Continued)

FOREIGN PATENT DOCUMENTS

| | | |
|---|---|---|
| KR | 10-1142752 | 4/2012 |
| KR | 10-2146828 | 8/2020 |

*Primary Examiner* — Nathan Danielsen
(74) *Attorney, Agent, or Firm* — KILE PARK REED & HOUTTEMAN PLLC

(57) ABSTRACT

A display device includes a display area and a non-display area adjacent to the display area; a first scan line that extends in a row direction and transmits a first scan signal; a first pixel part electrically connected to the first scan line; a second pixel part electrically connected to the first scan line and spaced apart from the first pixel part in the row direction; and a first inspection pad disposed between the first pixel part and the second pixel part and electrically connected to the first scan line.

20 Claims, 14 Drawing Sheets

(56) References Cited

U.S. PATENT DOCUMENTS

| | | |
|---|---|---|
| 2011/0248968 A1 | 10/2011 | Suh |
| 2015/0170982 A1 | 6/2015 | Jeong et al. |
| 2018/0122880 A1 | 5/2018 | Lee et al. |
| 2021/0375700 A1 | 12/2021 | Xiao et al. |

\* cited by examiner

DISPLAY DEVICE

CROSS-REFERENCE TO RELATED APPLICATION(S)

This is a continuation application of U.S. patent application Ser. No. 17/365,414, filed Jul. 1, 2021, now U.S. Pat. No. 11,557,245 issued on Jan. 17, 2023, the the disclosure of which is incorporated herein by reference in its entirety. U.S. patent application Ser. No. 17/365,414 claims priority to and benefit of Korean Patent Application No. 10-2020-0166124 under 35 U.S.C. § 119, filed on Dec. 1, 2020, in the Korean Intellectual Property Office, the entire contents of which are incorporated herein by reference.

BACKGROUND

(a) Technical Field

The disclosure relates to a display device. The disclosure relates to a display device having a reduced non-display area.

(b) Description of the Related Art

A tiled display device has a structure in which a plurality of display devices are bonded to each other. The display devices display images of different parts, and a viewer may watch an image in which the images of the parts are combined.

However, a seam line of the tiled display device may be defined by a non-display area (for example, a bezel) of each of the display devices. To improve the viewer's concentration and/or to provide the viewer with an optimal viewing experience, the elimination of the seam line becomes necessary. For example, it is necessary to develop a display device in which the non-display area is reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device with a reduced non-display area.

The objects of the disclosure are not limited to the above-described objects, and may be modified within the spirit and scope of the disclosure.

An embodiment provides a display device that may include a display area and a non-display area adjacent to the display area; a first scan line that extends in a row direction and transmits a first scan signal; a first pixel part electrically connected to the first scan line; a second pixel part electrically connected to the first scan line and spaced apart from the first pixel part in the row direction; and a first inspection pad disposed between the first pixel part and the second pixel part and electrically connected to the first scan line.

The first pixel part may be disposed in a first outermost area of the display area adjacent to the non-display area.

The display device may further include a second inspection pad electrically connected to the first scan line and spaced apart from the first inspection pad in the row direction.

The display device may further include a third pixel part electrically connected to the first scan line and spaced apart from the second pixel part in the row direction; and a fourth pixel part electrically connected to the first scan line and spaced apart from the third pixel part in the row direction, wherein the second inspection pad may be disposed between the third pixel part and the fourth pixel part.

The fourth pixel part may be disposed in a second outermost area of the display area adjacent to the non-display area and faces the first pixel part.

The display device may further include a second scan line that extends in the row direction and transmits a second scan signal; and a third inspection pad spaced apart from the first inspection pad in the row direction and electrically connected to the second scan line.

The second pixel part may be disposed between the first inspection pad and the third inspection pad.

The first pixel part may include a first conductive pattern disposed on a substrate; an active pattern disposed on the first conductive pattern; a second conductive pattern disposed on the active pattern; and a third conductive pattern disposed on the second conductive pattern and electrically connected to the first conductive pattern and the active pattern, and the first inspection pad and the third conductive pattern may be disposed on a same layer.

The display device may further include a data line that extends in a column direction intersecting the row direction and transmits a data voltage, the data line and the first conductive pattern may be disposed on a same layer; and a data bridge that electrically connects the data line and the first pixel part, the data bridge and the third conductive pattern being disposed on a same layer.

The display device may further include a sensing line that extends in a column direction intersecting the row direction and transmits a sensing voltage, the sensing line and the first conductive pattern being disposed on a same layer; and a sensing bridge that electrically connects the sensing line and the first pixel part, the sensing bridge and the third conductive pattern being disposed on a same layer.

The display device may further include a high power source voltage line that extends in a column direction intersecting the row direction and transmits a high power source voltage, the high power source voltage line and the first conductive pattern being disposed on a same layer; and a high power source voltage bridge that electrically connects the high power source voltage line and the first pixel part, the high power source voltage bridge and the third conductive layer being disposed on a same layer.

The display device may further include a low power source voltage line that extends in a column direction intersecting the row direction and transmits a low power source voltage, the low power source voltage line and the first conductive pattern being disposed on a same layer; and a low power source voltage bridge that electrically connects the low power source voltage line and the first pixel part, the low power source voltage bridge and the third conductive pattern being disposed on a same layer.

The first pixel part may include a first connecting electrode disposed on the third conductive pattern; a second connecting electrode disposed on the third conductive pattern and spaced apart from the first connecting electrode; a nano light emitting element disposed on the first connecting electrode; a first driving electrode disposed on the nano light emitting element and electrically contacting the first connecting electrode; and a second driving electrode that electrically contacts the second connecting electrode, the second driving electrode and the first driving electrode being disposed on a same layer.

The first pixel part may include a color conversion pattern disposed on the nano light emitting element.

The first pixel part may include a color filter disposed on the color conversion pattern.

An embodiment provides a display device that may include a display area and a non-display area adjacent to the display area; a first voltage line that extends in a column direction and transmits a first voltage; a first pixel part electrically connected to the first voltage line; a second pixel part electrically connected to the first voltage line and spaced apart from the first pixel part in the column direction; and an inspection pad electrically connected to the first voltage line.

The first pixel part may include a first conductive pattern disposed on a substrate; an active pattern disposed on the first conductive pattern; a second conductive pattern disposed on the active pattern; and a third conductive pattern disposed on the second conductive pattern and electrically connected to the first conductive pattern and the active pattern, and the inspection pad and the first conductive pattern may be disposed on a same layer.

An embodiment provides a display device that may include a display area and a non-display area adjacent to the display area; a first voltage line that extends in a column direction and transmits a first voltage; a second voltage line that extends in the column direction and transmits a second voltage; a first pixel part electrically connected to the first voltage line and the second voltage line; a second pixel part electrically connected to the first voltage line and the second voltage line and spaced apart from the first pixel part in the column direction; and an inspection pad electrically connected to the second voltage line, and wherein the second voltage line may be disposed between the first voltage line and the first pixel part.

The first pixel part may include a first conductive pattern disposed on a substrate; an active pattern disposed on the first conductive pattern; a second conductive pattern disposed on the active pattern; and a third conductive pattern disposed on the second conductive pattern and electrically connected to the first conductive pattern and the active pattern, and the inspection pad and the third conductive pattern may be disposed on a same layer.

The second voltage line and the first conductive pattern may be disposed on a same layer.

The display device according to embodiments may include an inspection pad disposed in a display area and a scan driver disposed in a display area. For example, the inspection pad and the scan driver may be disposed between pixel columns. Accordingly, a non-display area surrounding or adjacent to the display area may be reduced. The inspection pad may be electrically connected to a line that transmits a signal and/or voltage. Accordingly, it is possible to detect a defective position of the line through the inspection pad.

However, the effects of the disclosure are not limited to the above-described effects, and may be variously modified within the spirit and scope of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
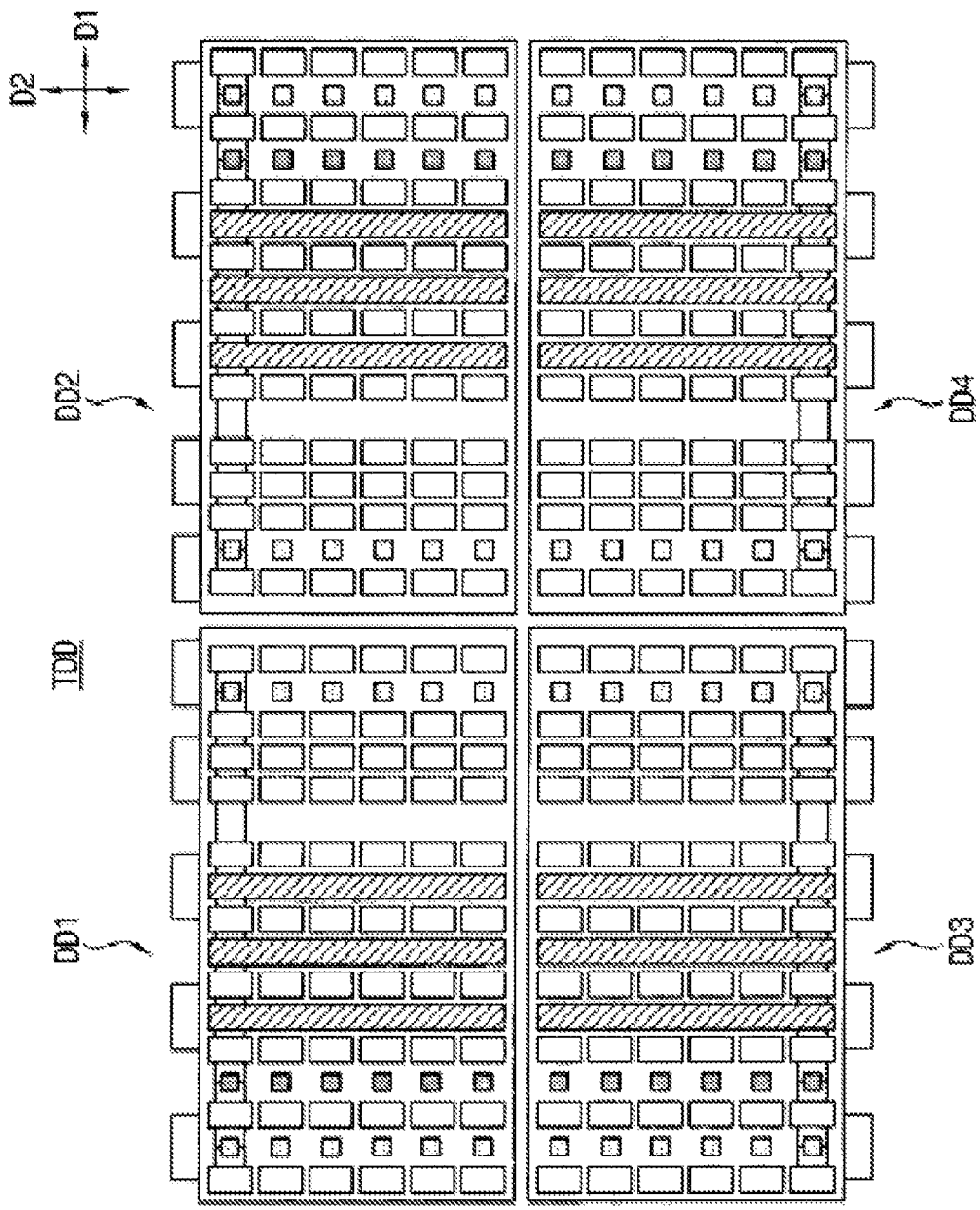
FIG. 1 illustrates a top plan view of a tiled display device in which display devices according to an embodiment are bonded to each other.

Hereinafter, embodiments will be described in detail with reference to the accompanying drawings. The same reference numeral is used for the same constituent element or elements in the drawing, and a duplicate description for the same constituent element or elements will be omitted.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a top plan view of a tiled display device in which display devices according to an embodiment are bonded to each other.

Referring to FIG. 1, the display devices according to an embodiment may be bonded to each other to form a tiled display device TDD. For example, a first display device DD1, a second display device DD2, a third display device DD3, and a fourth display device DD4 may be bonded to each other. The first display device DD1 may display a first image, the second display device DD2 may display a second image, the third display device DD3 may display a third image, and the fourth display device DD4 may display a fourth image. A viewer may watch an image in which the first to fourth images are combined.

In an embodiment, the first to fourth display devices DD1, DD2, DD3, and DD4 may have substantially the same structure. For example, the second display device DD2 may be substantially symmetrical to the first display device DD1 in a first direction D1. The third display device DD3 may be substantially symmetrical to the first display device DD1 in a second direction D2. For example, the second direction D2 may be substantially perpendicular to the first direction D1. The first direction D1 may be a row direction, and the second direction D2 may be a column direction.

Figure 2:
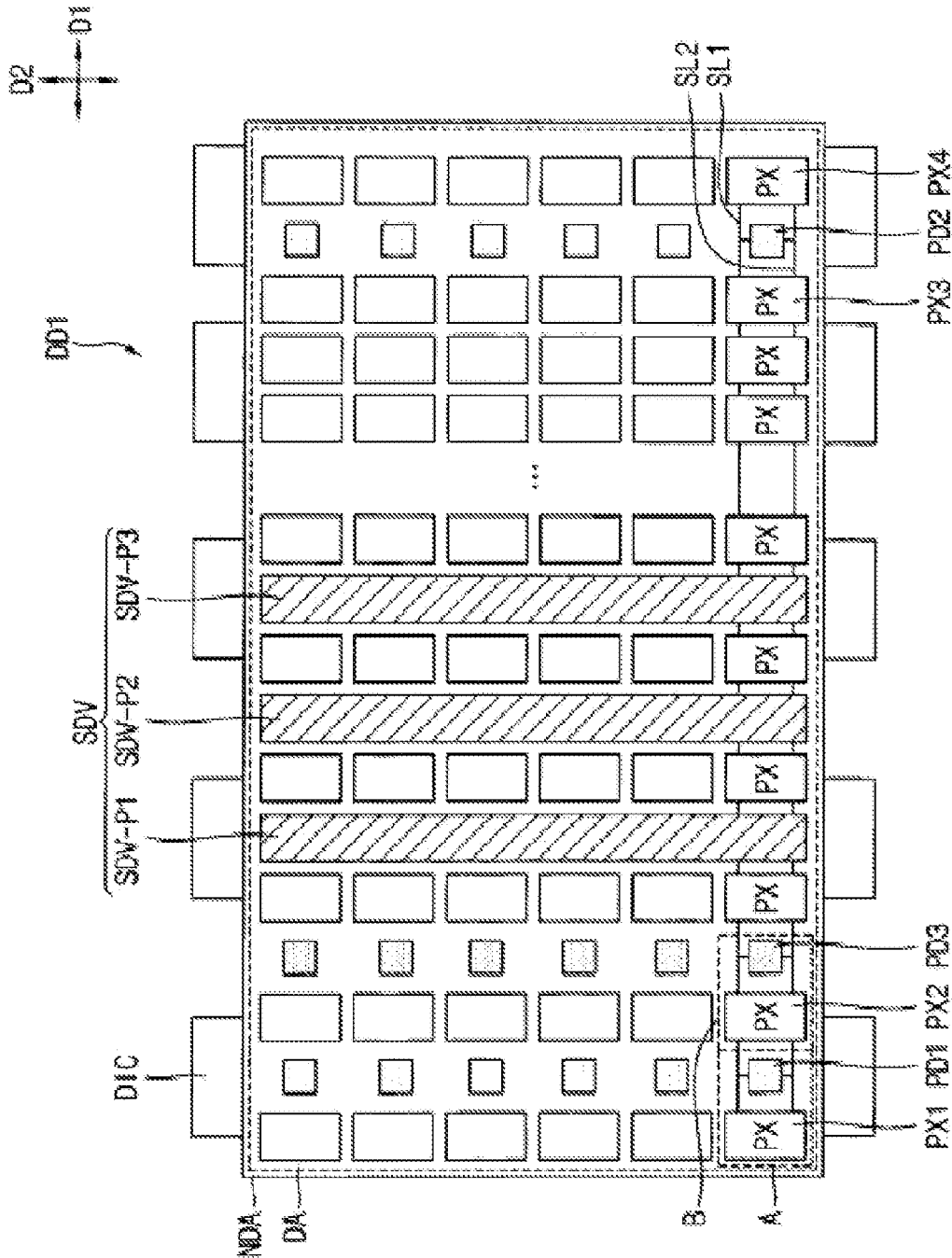
FIG. 2 illustrates the housing member in a top plan view of a display device according to an embodiment.
Figure 3:
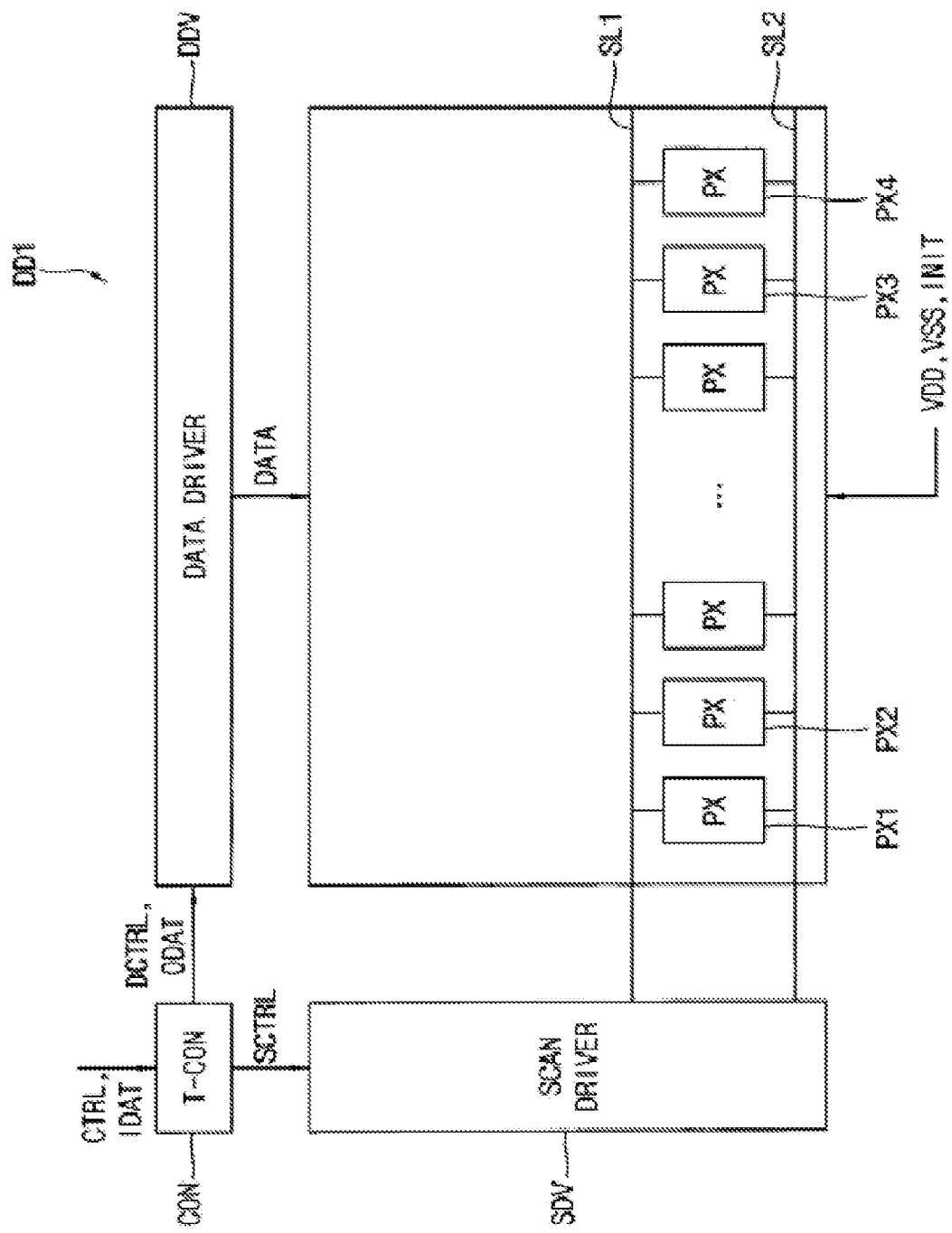
FIG. 3 illustrates a block diagram of the display device of FIG. 2.

FIG. 2 illustrates the housing member in a top plan view of a display device according to an embodiment, and FIG. 3 illustrates a block diagram of the display device of FIG. 2.

Referring to FIG. 2 and FIG. 3, the first display device DD1 according to an embodiment may be partitioned into a display area DA and a non-display area NDA. For example, a plurality of pixel parts PX, a scan driver SDV, a first inspection pad PD1, a second inspection pad PD2, and a third inspection pad PD3 may be disposed in the display area DA. The non-display area NDA may be disposed to surround or to be adjacent to the display area DA. The non-display area NDA may be an area in which the pixel parts PX may not be disposed. For example, a plurality of data integrated circuits DIC may be disposed in the non-display area NDA.

The pixel parts PX may be disposed in the display area DA of the first display device DD1. The pixel parts PX may receive a first scan signal SS1, a second scan signal SS2, and a third scan signal SS3 from the scan driver SDV, and may receive a data voltage DATA from a data driver DDV. The pixel parts PX may receive a high power source voltage VDD, a low power source voltage VSS, and a sensing voltage INIT.

The scan driver SDV may be disposed in the display area DA of the first display device DD1. The scan driver SDV may receive a scan control signal SCTRL from a timing controller CON (T-CON). The scan driver SDV may generate the first scan signal SS1, the second scan signal SS2, and the third scan signal SS3. The first scan signal SS1 and the second scan signal SS2 may be transmitted through a first scan line SL1, and the third scan signal SS3 may be transmitted through a second scan line SL2.

In an embodiment, as shown in FIG. 2, the scan driver SDV may be divided and inserted into the display area DA. For example, the scan driver SDV may include a first part scan driver SDV-P1, a second part scan driver SDV-P2, and a third part scan driver SDV-P3. The first part scan driver SDV-P1, the second part scan driver SDV-P2, and the third part scan driver SDV-P3 may be mounted between pixel columns, respectively. As the scan driver SDV is divided and disposed in the display area DA, the non-display area NDA may be reduced.

The data driver DDV may be disposed in the non-display area NDA of the first display device DD1. The data driver DDV may receive a data control signal DCTRL and output image data ODAT from the timing controller CON (T-CON). The data driver DDV may generate the data voltage DATA. The data voltage DATA may be transmitted to first to third data lines DL1, DL2, and DL3.

In an embodiment, the data driver DDV may be implemented with the data integrated circuits DIC. For example, the data integrated circuits DIC may be disposed at one side or a side of the first display device DD1. Accordingly, among the non-display area NDA, a non-display area NDA in which the data integrated circuits DIC may not be disposed may be reduced.

The timing controller CON (T-CON) may receive a control signal CTRL and input image data I DAT from an external device. The timing controller CON (T-CON) may generate the data control signal DCTRL, the output image data ODAT, and the scan control signal SCTRL. The timing controller CON (T-CON) may control the data driver DDV and the scan driver SDV.

In an embodiment, as shown in FIG. 2, the pixel parts PX may include a first pixel part PX1, a second pixel part PX2, a third pixel part PX3, and a fourth pixel part PX4. For example, the first to fourth pixel parts PX1, PX2, PX3, and PX4 may be disposed in one pixel row or a pixel row. The first pixel part PX1 may be disposed in a first outermost area of the display area DA adjacent to the non-display area NDA. The second pixel part PX2 may be spaced apart from the first pixel part PX1 in the first direction D1. The fourth pixel part PX4 may be disposed in a second outermost area of the display area DA adjacent to the non-display area, and may face the first pixel part PX1. The third pixel part PX3 may be spaced apart from the fourth pixel part PX4 in the first direction D1. However, the arrangement and locations of the pixel parts are not limited thereto, and other arrangements and locations are possible within the spirit and the scope of the disclosure.

The first to fourth pixel parts PX1, PX2, PX3, and PX4 may be electrically connected to the first scan line SL1. In other words, the first to fourth pixel parts PX1, PX2, PX3, and PX4 may receive the first scan signal SS1 and the second scan signal SS2 from the first scan line SL1. The first to fourth pixel parts PX1, PX2, PX3, and PX4 may be electrically connected to the second scan line SL2. In other words, the first to fourth pixel parts PX1, PX2, PX3, and PX4 may receive the third scan signal SS3 from the second scan line SL2.

In an embodiment, as shown in FIG. 2, the first display device DD1 may include the first to third inspection pads PD1, PD2, and PD3 that are disposed in the display area DA. The first to third inspection pads PD1, PD2, and PD3 may be inspection pads for performing an open short (OS) inspection. For example, an OS inspection may be an inspection that detects a defect of a line (for example, an open or short circuit of a line). The first to third inspection pads PD1, PD2, and PD3 may be pads to which a probe pin contacts.

The first and second inspection pads PD1 and PD2 may be electrically connected to the first scan line SL1. In other words, the first and second inspection pads PD1 and PD2 may be inspection pads for detecting a defective position of the first scan line SL1. The first inspection pad PD1 may be disposed between the first pixel part PX1 and the second pixel part PX2, and the second inspection pad PD2 may be spaced apart from the first inspection pad PD1 in the first direction D1. For example, the second inspection pad PD2 may be disposed between the third pixel part PX3 and the fourth pixel part PX4. In other words, the second inspection pad PD2 may face the first inspection pad PD1. However, the disclosure is not limited thereto.

In an embodiment, the first inspection pad PD1 may be a feeding pad, and the second inspection pad PD2 may be a receiving pad. However, the second inspection pad PD2 may be omitted depending on a method of performing the OS inspection.

In an embodiment, the third inspection pad PD3 may be electrically connected to the second scan line SL2. In other words, the third inspection pad PD3 may be a pad for detecting a defective position of the second scan line SL2. The third inspection pad PD2 may be spaced apart from the first inspection pad PD1 in the first direction D1. In an embodiment, in case that the first display device DD1 does not include the second scan line SL2, the third inspection pad PD3 may be omitted.

However, the positions at which the first to third inspection pads PD1, PD2, and PD3 are disposed are not limited to the embodiment described above. The first to third inspection pads PD1, PD2, and PD3 may be disposed in the display area DA. In other words, the first to third inspection pads PD1, PD2, and PD3 may be disposed between the pixel parts PX.

Figure 4:
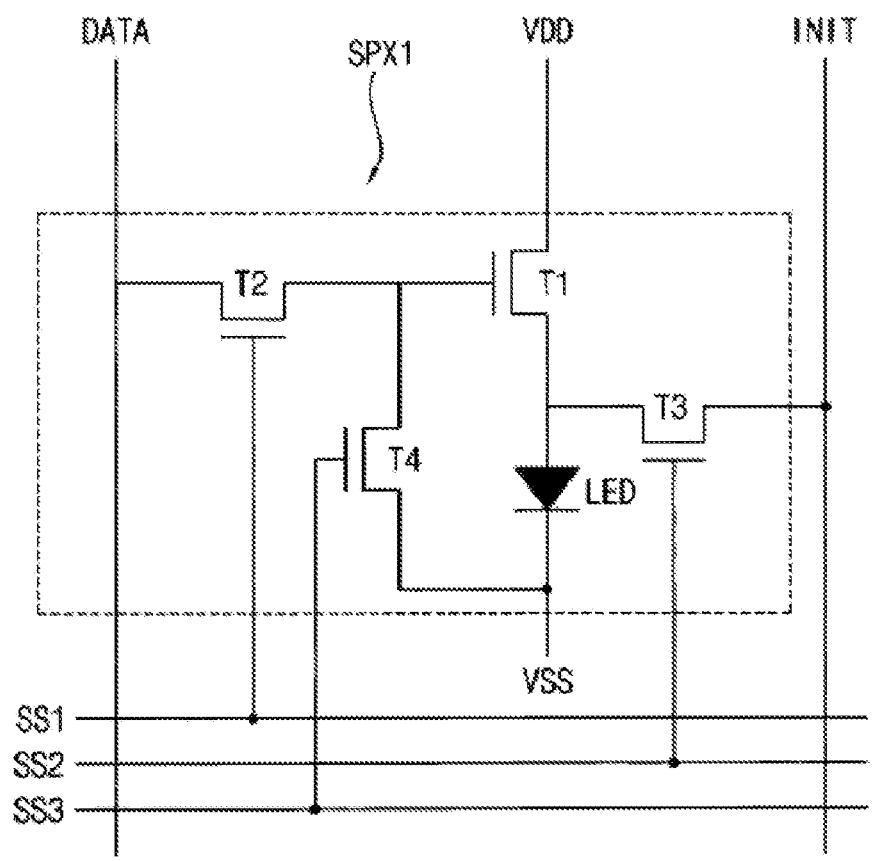
FIG. 4 illustrates an equivalent circuit diagram of a sub-pixel part included in the display device of FIG. 2.

FIG. 4 illustrates an equivalent circuit diagram of a sub-pixel part included in the display device of FIG. 2.

Figure 5:
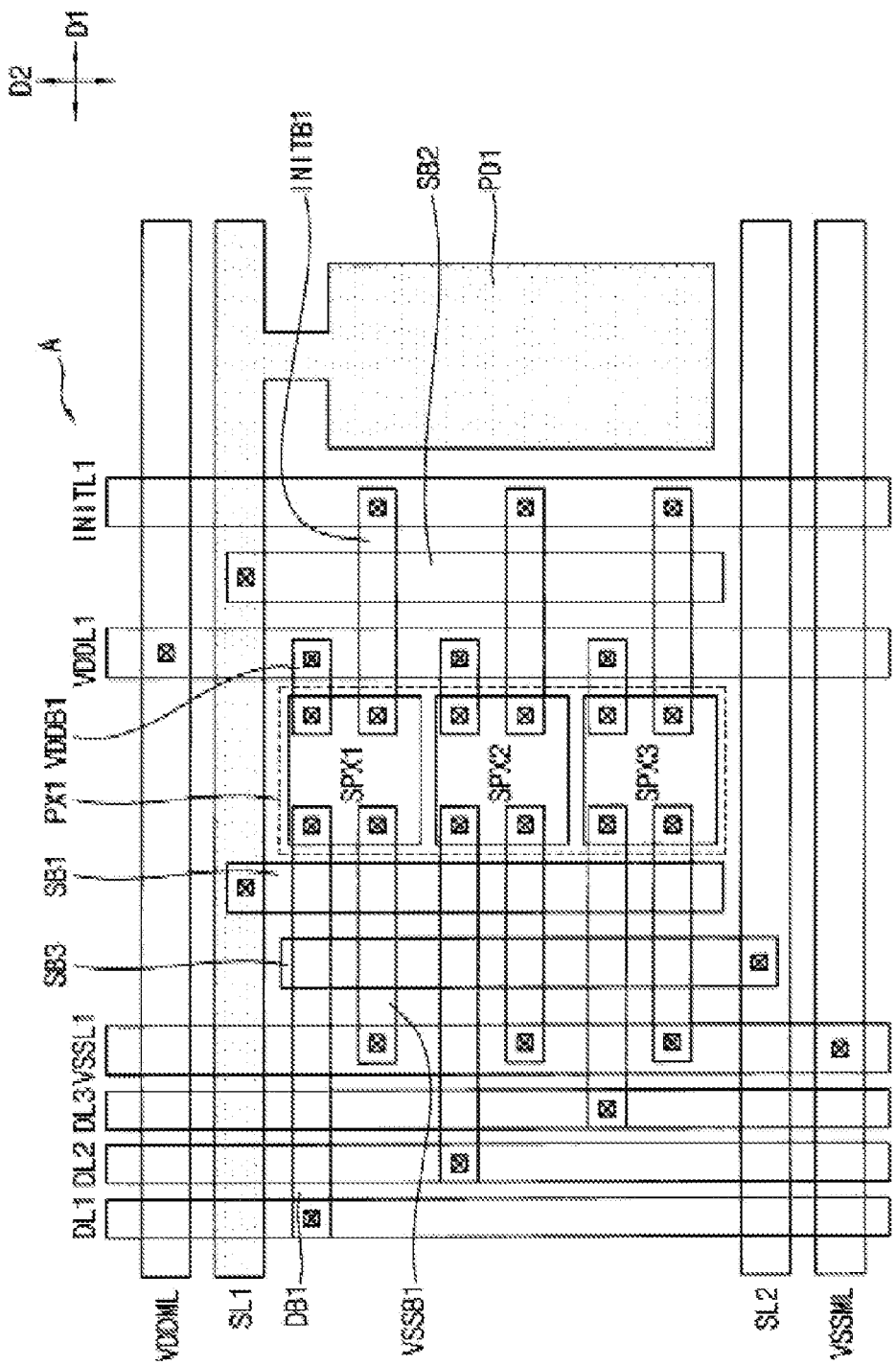
FIG. 5 illustrates an enlarged view of area "A" of FIG. 2.

Referring to FIG. 3 and FIG. 4, each of the pixel parts PX may include a plurality of sub-pixel parts. For example, the first pixel part PX1 may include a first sub-pixel part SPX1, a second sub-pixel part SPX2, and a third sub-pixel part SPX3 as illustrated in FIG. 5. Circuit structures of the first to third sub-pixel parts SPX1, SPX2, and SPX3 may be substantially the same.

The first sub-pixel part SPX1 may include a first transistor T1, a second transistor T2, a third transistor T3, a fourth transistor T4, and a light emitting element LED.

The first transistor T1 may include a first terminal (for example, source terminal), a second terminal (for example, drain terminal), and a gate terminal. The first terminal may be provided with the high power source voltage VDD. The second terminal may be electrically connected to the light emitting element LED. The gate terminal may be electrically connected to the second transistor T2. The first transistor T1 may generate a driving current based on the high power source voltage VDD and the data voltage DATA.

The second transistor T2 may include a first terminal (for example, source terminal), a second terminal (for example, drain terminal), and a gate terminal. The first terminal may receive the data voltage DATA. The second terminal may be electrically connected to the first transistor T1. The gate terminal may receive the first scan signal SS1. The second transistor T2 may transmit the data voltage DATA in response to the first scan signal SS1.

The third transistor T3 may include a first terminal (for example, source terminal), a second terminal (for example, drain terminal), and a gate terminal. The first terminal may be electrically connected to the first transistor T1. The second terminal may receive the sensing voltage INIT. The gate terminal may receive the second scan signal SS2. The third transistor T3 may transmit the sensing voltage INIT in response to the second scan signal SS2.

The fourth transistor T4 may include a first terminal (for example, source terminal), a second terminal (for example, drain terminal), and a gate terminal. The first terminal may receive the low power source voltage VSS. The second terminal may be electrically connected to the first transistor T1. The gate terminal may receive the third scan signal SS3. The fourth transistor T4 may transmit the low power source voltage VSS in response to the third scan signal SS3. For example, the fourth transistor T4 may be a transistor for a black frame insert.

Figure 6:
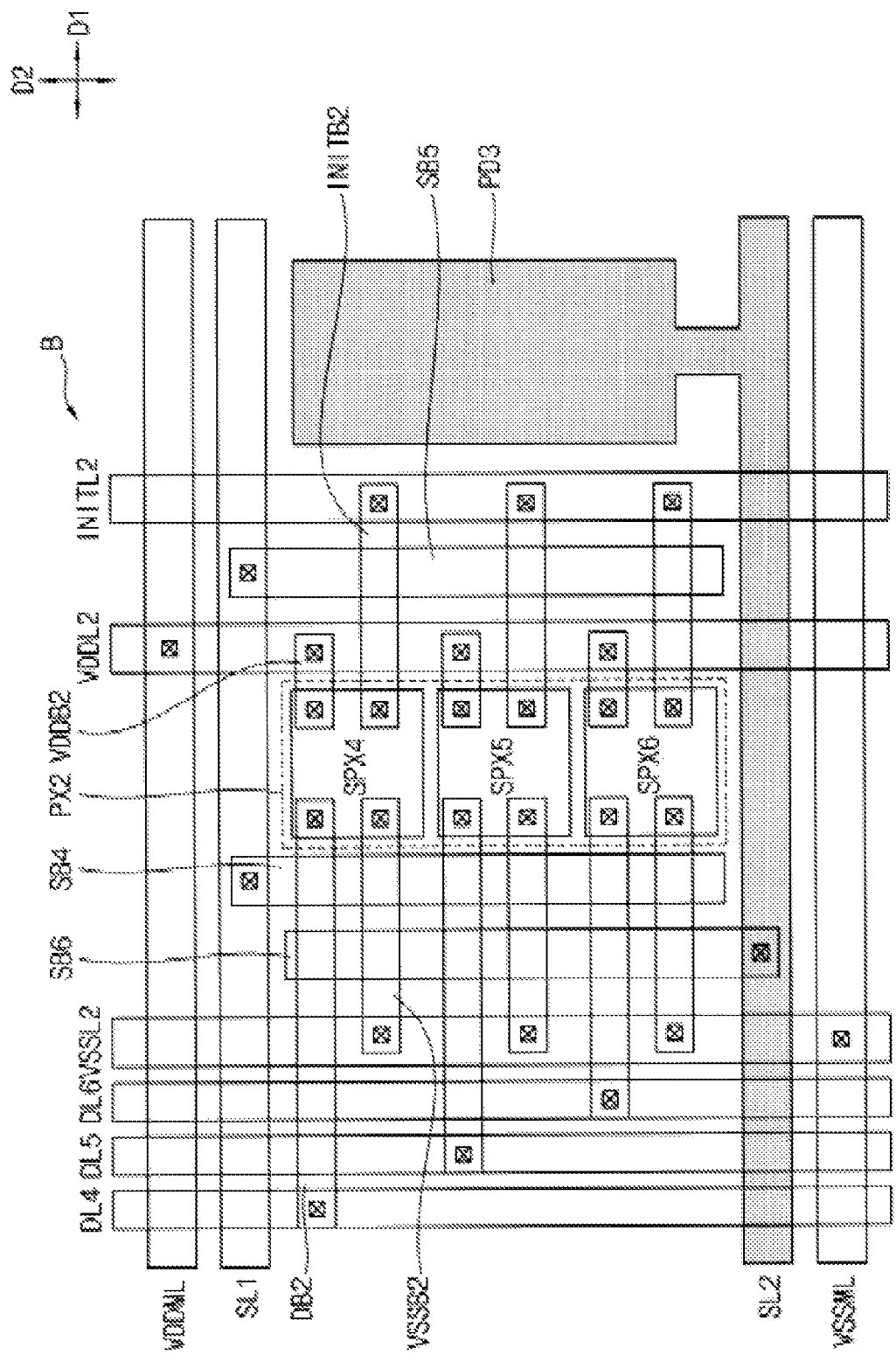
FIG. 6 illustrates an enlarged view of area "B" of FIG. 2.

FIG. 5 illustrates an enlarged view of area "A" of FIG. 2, and FIG. 6 illustrates an enlarged view of area "B" of FIG. 2.

Referring to FIG. 5, the first inspection pad PD1 may be formed with the first scan line SL1, and may be disposed between the first pixel part PX1 and the second pixel part PX2. The first pixel part PX1 may include the first to third sub-pixel parts SPX1, SPX2, and SPX3, and structures of the first to third sub-pixel parts SPX1, SPX2, and SPX3 may be substantially the same.

For example, the first to third data lines DL1, DL2, and DL3 may extend in the second direction D2. The first data line DL1 may provide the data voltage DATA to the first sub-pixel part SPX1 through a first data bridge DB1.

A first low power source voltage line VSSL1 may extend in the second direction D2. The first low power source voltage line VSSL1 may provide the low power source voltage VSS to the first sub-pixel part SPX1 through a first low power source voltage bridge VSSB1.

A first high power source voltage line VDDL1 may extend in the second direction D2. The first high power source voltage line VDDL1 may provide the high power source voltage VDD to the first sub-pixel part SPX1 through a first high power source voltage bridge VDDB1.

A first sensing voltage line INITL1 may extend in the second direction D2. The first sensing voltage line INITL1 may provide the sensing voltage INIT to the first sub-pixel part SPX1 through a first sensing voltage bridge INITB1.

A high power source voltage mesh line VDDML may be disposed on the first high power source voltage line VDDL1, and may extend in the first direction D1. The high power source voltage mesh line VDDML may be electrically connected to the first high power source voltage line VDDL1, and may prevent a voltage of the high power source voltage VDD from dropping.

The first scan line SL1 may be formed on the same layer or a same layer as the high power source voltage mesh line VDDML, and may extend in the first direction D1. The first scan line SL1 may provide the first scan signal SS1 to a first scan bridge SB1. The data voltage DATA may be provided to the first sub-pixel part SPX1 in response to the first scan signal SS1. The first scan line SL1 may provide the second scan signal SS2 to a second scan bridge SB2. The sensing voltage INIT may be provided to the first sub-pixel part SPX1 in response to the second scan signal SS2.

The first inspection pad PD1 may be formed on the same layer or a same layer as the first scan line SL1, and may be electrically connected to the first scan line SL1. In other words, the first inspection pad PD1 and the first scan line SL1 may be integral with each other. A defective position of the first scan line SL1 may be detected through the first inspection pad PD1.

The second scan line SL2 may be formed or disposed on the same layer or a same layer as the first scan line SL1, and may extend in the first direction D1. The second scan line SL2 may provide the third scan signal SS3 to the third scan bridge SB3. The low power source voltage VSS may be provided to the first sub-pixel part SPX1 in response to the third scan signal SS3.

The low power source voltage mesh line VSSML may be disposed on the first low power source voltage line VSSL1, and may extend in the first direction D1. The low power source voltage mesh line VSSML may be electrically connected to the first low power source voltage line VSSL1, and may prevent a voltage of the low power source voltage VSS from dropping.

Referring to FIG. 6, the third inspection pad PD3 may be formed with the second scan line SL2, and may be spaced apart from the first inspection pad PD1 in the first direction D1. For example, the second pixel part PX2 may be disposed between the first inspection pad PD1 and the third inspection pad PD3. The second pixel part PX2 may include the fourth to sixth sub-pixel parts SPX4, SPX5, and SPX6, and structures of the fourth to sixth sub-pixel parts SPX4, SPX5, and SPX6 may be substantially the same as those of the first to third sub-pixel parts SPX1, SPX2, and SPX3.

The fourth to sixth data lines DL4, DL5, and DL6 may be substantially the same as the first to third data lines DL1, DL2, and DL3, and the second low power source voltage line VSSL2, the second high power source voltage line VDDL2, and the second sensing voltage line INITL2 may be substantially the same as the first low power source voltage line VSSL1, the first high power source voltage line VDDL1, and the first sensing voltage line INITL1. Fourth to sixth scan bridges SB4, SB5, and SB6 may be substantially the same as the first to third scan bridges SB1, SB2, and SB3, and a second data bridge DB2, a second low power source voltage bridge VSSB2, a second high power source voltage bridge VDDB2, and a second sensing bridge INITB2 may be substantially the same as the first data bridge DB1, the first low power source voltage bridge VSSB1, the first high power source voltage bridge VDDB1, and the first sensing bridge INITB1.

The third inspection pad PD3 may be formed on the same layer or a same layer as the second scan line SL2, and may be electrically connected to the second scan line SL2. In other words, the third inspection pad PD3 and the second scan line SL2 may be integral with each other. A defective position of the second scan line SL2 may be detected through the third inspection pad PD3.

Figure 7:
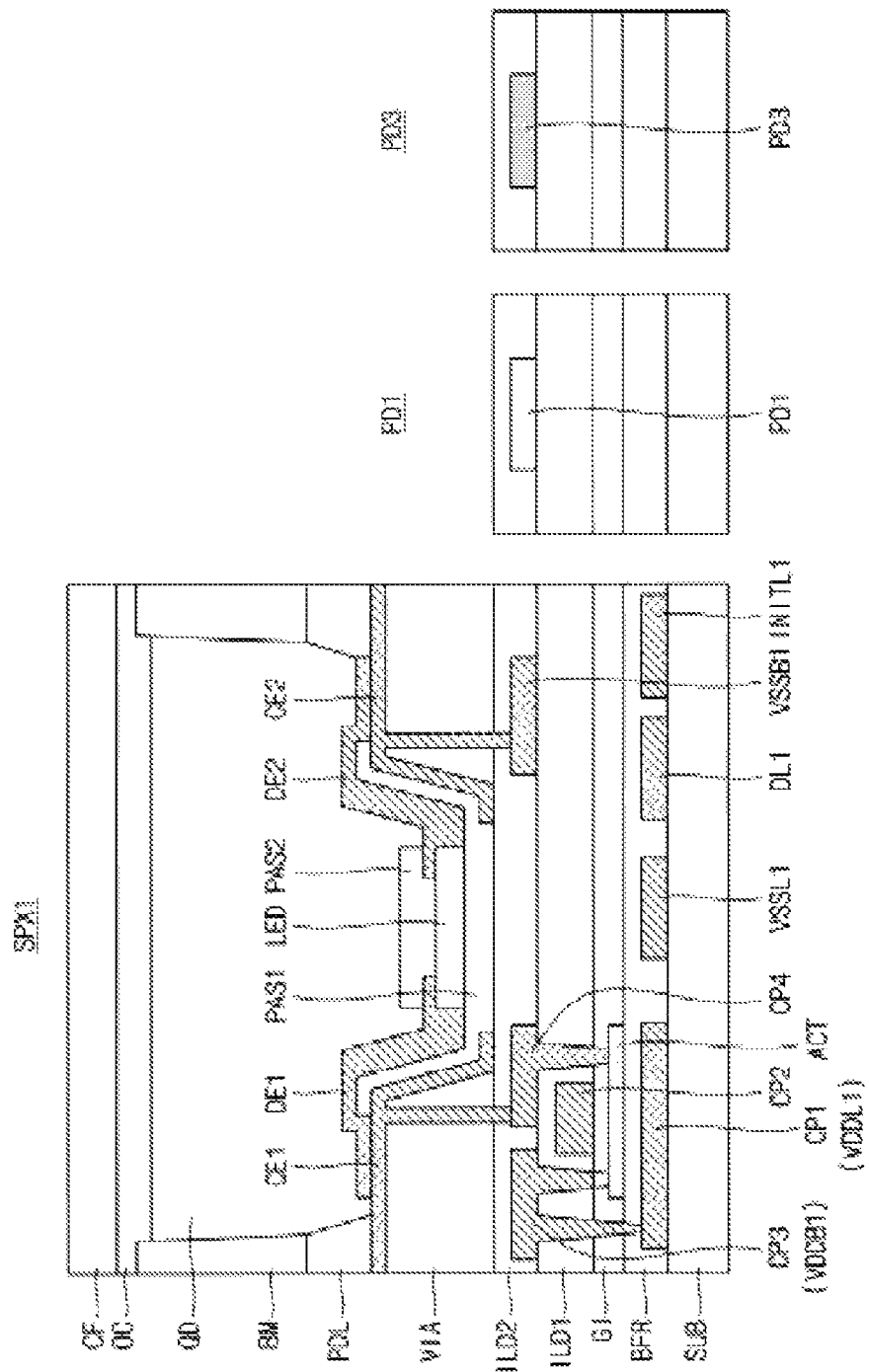
FIG. 7 illustrates a schematic cross-sectional view of the display device of FIG. 2.

FIG. 7 illustrates a schematic cross-sectional view of the display device of FIG. 2.

Figure 8:
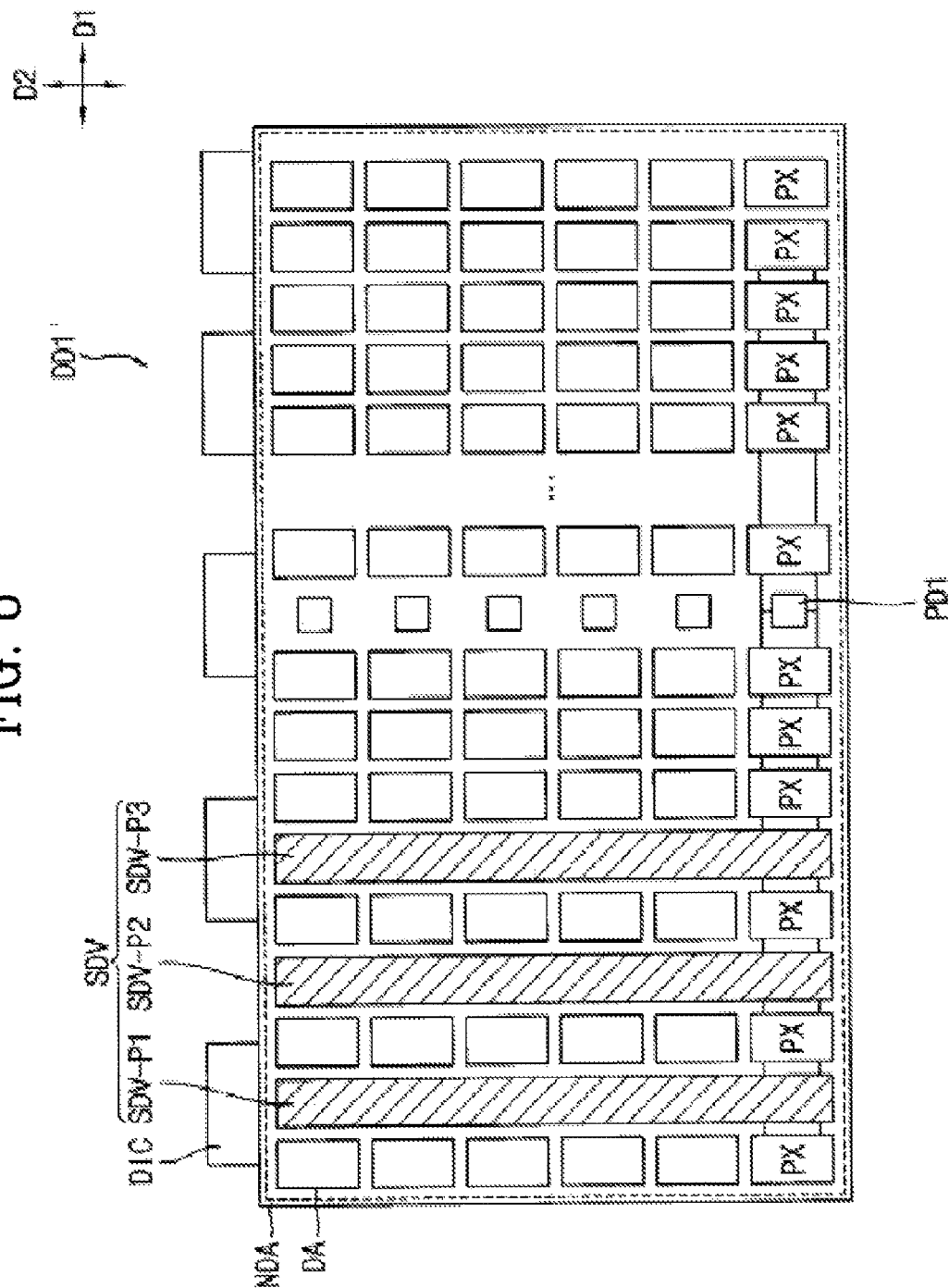
FIG. 8 illustrates a top plan view of a display device according to an embodiment.

Referring to FIG. 5, FIG. 7, and FIG. 8, the first sub-pixel part SPX1 may include a substrate SUB, a first conductive pattern CP1, a buffer layer BFR, an active pattern ACT, a gate insulating layer GI, a second conductive pattern. CP2, a first insulating layer ILD1, a third conductivity pattern CP3, a fourth conductive pattern CP4, a second insulating layer ILD2, a via insulating layer VIA, a first connecting electrode CE1, a second connecting electrode CE2, a first passivation pattern PAS1, a light emitting element LED, a first driving electrode DE1, a second driving electrode DE2, a second passivation pattern PAS2, a pixel defining layer PDL, a black matrix BM, a color conversion pattern QD, a planarization layer OC, and a color filter CF.

The substrate SUB may include a transparent or opaque material. For example, the substrate SUB may include glass, quartz, plastic, or the like within the spirit and the scope of the disclosure.

The first conductive pattern CP1 may be disposed on the substrate SUB. The first conductive pattern CP1 may include a conductive material. For example, the first conductive pattern CP1 may include metal. The first conductive pattern CP1 shown in FIG. 7 may correspond to the first high power source voltage line VDDL1, but the disclosure is not limited thereto.

The buffer layer BFR may be disposed on the substrate SUB, and may cover or overlap the first conductive pattern CP1. The buffer layer BFR may include an insulating material. For example, the buffer layer BFR may include a silicon oxide, a silicon nitride, a silicon oxynitride, or the like within the spirit and the scope of the disclosure.

The active pattern ACT may be disposed on the buffer layer BFR. The active pattern ACT may include a semiconductor material. For example, the active pattern ACT may include amorphous silicon, polycrystalline silicon, a metal oxide, and the like within the spirit and the scope of the disclosure.

The gate insulating layer GI may be disposed on the buffer layer BFR, and may cover or overlap the active pattern ACT. The gate insulating layer GI may include an insulating material.

The second conductive pattern CP2 may be disposed on the gate insulating layer GI. The second conductive pattern CP2 may overlap the active pattern ACT, and may include a metallic material.

The first insulating layer ILD1 may be disposed on the gate insulating layer GI, and may cover or overlap the second conductive pattern CP2. The first insulating layer ILD1 may include an insulating material.

The third conductive pattern CP3 may be disposed on the first insulating layer ILD1. The third conductive pattern CP3 may be electrically connected to the first conductive pattern CP1 and the active pattern ACT. The third conductive pattern CP3 shown in FIG. 7 may correspond to the first high power source voltage bridge VDDB1, but the disclosure is not limited thereto.

The fourth conductive pattern CP4 may be disposed on the same layer or a same layer as the third conductive pattern CP3. The fourth conductive pattern CP4 may be electrically connected to the active pattern ACT and the first connecting electrode CE1.

The second insulating layer ILD2 may be disposed on the first insulating layer ILD1, and may cover or overlap the third and fourth conductive patterns CP3 and CP4. The second insulating layer ILD2 may include an insulating material.

The via insulating layer VIA may be disposed on the second insulating layer ILD2. The via insulating layer VIA may include an insulating material. An opening exposing the second insulating layer ILD2 and a contact hole exposing the fourth conductive pattern CP4 may be formed in the via insulating layer VIA.

The first passivation pattern PAS1 may be disposed in the opening. The light emitting element LED may be disposed on the first passivation pattern PAS1. The second passivation pattern PAS2 may be disposed on the light emitting element LED. The first and second passivation patterns PAS1 and PAS2 may fix or set in place the light emitting element LED.

The first driving electrode DE1 may electrically contact the first connecting electrode CE1 and the light emitting element LED. The first driving electrode DE1 may supply a driving current to the light emitting element LED. The second driving electrode DE2 may electrically contact the second connecting electrode CE2 and the light emitting element LED. The second driving electrode DE2 may provide the low power source voltage VSS to the light emitting element LED.

The light emitting element LED may be disposed between the first driving electrode DE1 and the second driving electrode DE2. In an embodiment, the light emitting element LED may be a nano light emitting diode. The light emitting element LED may include an active layer, and may emit light in a given wavelength range. For example, the light emitting element LED may emit blue light with a peak wavelength ranging from about 440 nm to about 480 nm.

The pixel defining layer PDL may be disposed on the via insulating layer VIA, and may define a light emitting area. For example, the pixel defining layer PDL may be disposed to surround the light emitting area.

The black matrix BM may be disposed on the pixel defining layer PDL. The black matrix BM may block light transmission. For example, the black matrix BM may include an organic light blocking material and a liquid repellent component.

The color conversion pattern QD may be disposed on the second passivation pattern PAS2. In an embodiment, the color conversion pattern QD may include a base resin, a scatterer, and a wavelength shifter. The base resin may include a transparent organic material, and may have a relatively high light transmittance. The scatterer may have a refractive index different from that of the base resin, and may form an optical interface with the base resin. The wavelength shifter may convert or shift a peak wavelength of incident light. For example, the wavelength shifter may convert blue light into red light in the range of about 610 nm to about 650 nm.

The planarization layer OC may be disposed on the black matrix BM and the color conversion pattern QD. The planarization layer OC may have a substantially flat upper surface.

The color filter CF may be disposed on the planarization layer OC. The color filter CF may selectively transmit light of a first color (for example, red), and selectively block light of a second color (for example, green) and light of a third color (for example, blue).

In an embodiment, the first inspection pad PD1 may be disposed on the same layer or a same layer as the third conductive pattern CP3. For example, the first inspection pad PD1 may be disposed on the same layer or a same layer as the first scan line SL1 and the second scan line SL2.

In an embodiment, the third inspection pad PD3 may be disposed on the same layer or a same layer as the third conductive pattern CP3. For example, the third inspection pad PD3 may be disposed on the same layer or a same layer as the first inspection pad PD1, the first scan line SL1, and the second scan line SL2.

FIG. 8 illustrates a top plan view of a display device according to an embodiment.

Referring to FIG. 8, a first display device DD1' according to an embodiment may be substantially the same as the first display device DD1 described above with reference to FIG. 2, except for a position at which the scan driver SDV is disposed and a position at which the first inspection pad PD1 is disposed.

For example, the scan driver SDV and the first inspection pad PD1 may be disposed in the display area DA.

The scan driver SDV may include the first to third part scan drivers SDV-P1, SDV-P2, and SDV-P3, and the first to third part scan drivers SDV-P1, SDV-P2, and SDV-P3 may each be mounted between pixel columns.

The first inspection pad PD1 may be electrically connected to the first scan line SL1, and may be disposed between arbitrary pixel columns. The position at which the first inspection pad PD1 is disposed may be freely set in the display area DA as necessary.

As described above, the first display device DD1' may not include the second inspection pad PD2 and the third inspection pad PD3 described above with reference to FIG. 2.

Figure 9:
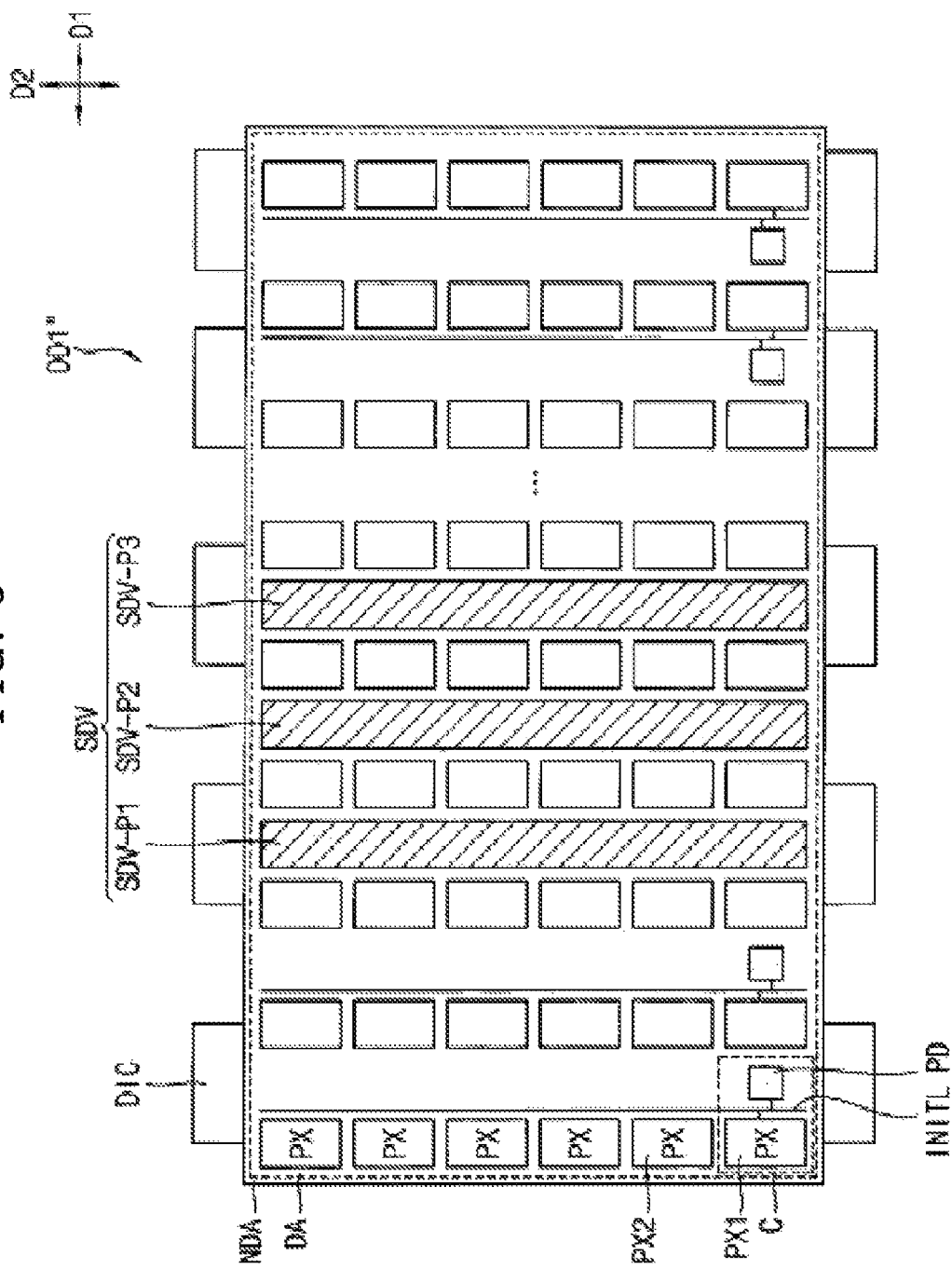
FIG. 9 illustrates a top plan view of a display device according to an embodiment.
Figure 10:
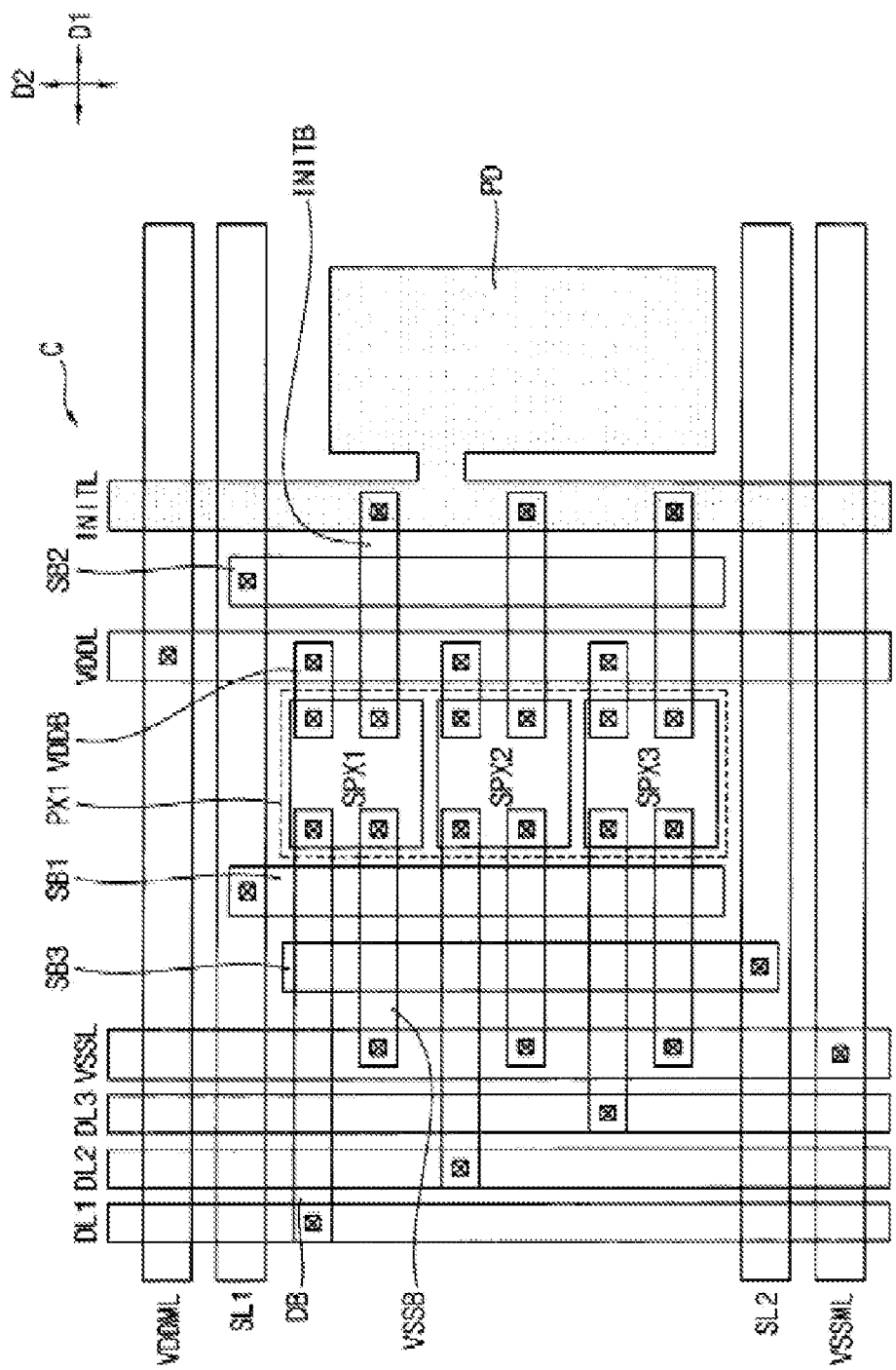
FIG. 10 illustrates an enlarged view of area "C" of FIG. 9.
Figure 11:
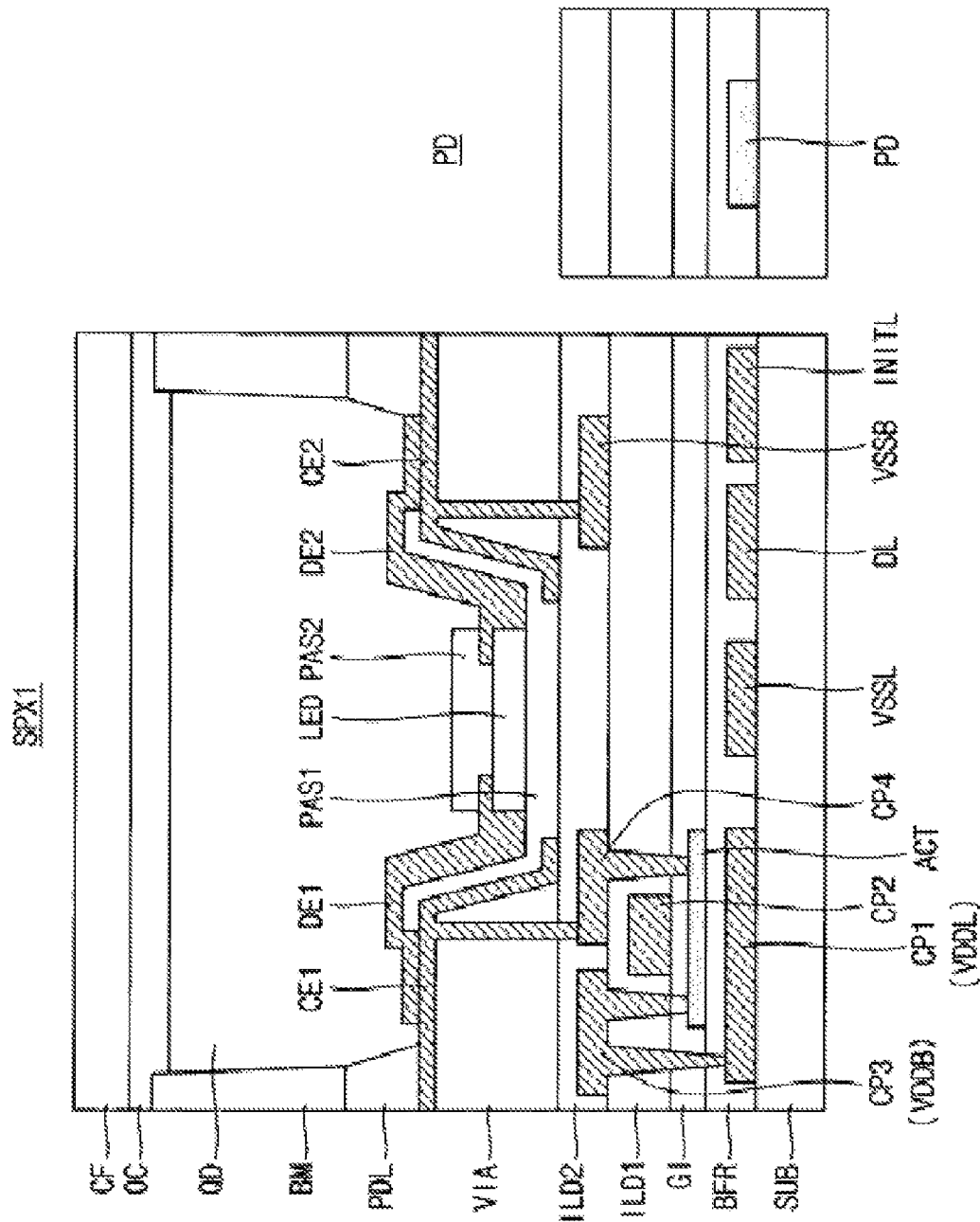
FIG. 11 illustrates a schematic cross-sectional view of the display device of FIG. 9.

FIG. 9 illustrates a top plan view of a display device according to an embodiment, FIG. 10 illustrates an enlarged view of area "C" of FIG. 9, and FIG. 11 illustrates a schematic cross-sectional view of the display device of FIG. 9.

Referring to FIG. 9, a first display device DD1" according to an embodiment may be partitioned into the display area DA and the non-display area NDA. For example, a plurality of pixel parts PX, a scan driver SDV, and an inspection pad PD may be disposed in the display area DA. The non-display area NDA may be disposed to surround or to be adjacent to the display area DA. The non-display area NDA may be an area in which the pixel parts PX are not disposed. For example, a plurality of data integrated circuits DIC may be disposed in the non-display area NDA. However, the scan driver SDV and the data integrated circuits DIC may be substantially the same as the scan driver SDV and the data integrated circuits DIC described above with reference to FIG. 2.

In an embodiment, as shown in FIG. 9, the pixel parts PX may include the first pixel part PX1 and the second pixel part PX2. For example, the first and second pixel parts PX1 and PX2 may be disposed in one pixel column or a pixel column. The first pixel part PX1 may be disposed in an outermost area of the display area DA adjacent to the non-display area NDA. The second pixel part PX2 may be spaced apart from the first pixel part PX1 in the second direction D2.

The first and second pixel parts PX1 and PX2 may be electrically connected to a first voltage line. In other words, the first and second pixel parts PX1 and PX2 may receive a first voltage from the first voltage line. The first voltage line may be an arbitrary voltage line that extends in the second direction D2 and transmits a voltage to the first and second pixel parts PX1 and PX2. In an embodiment, the first voltage line may be a sensing voltage line INITL. However, the first voltage line is not limited thereto.

The inspection pad PD may be an inspection pad for performing an OS inspection. For example, the inspection pad PD may be a pad that a probe pin contacts.

The inspection pad PD may be electrically connected to the sensing voltage line INITL. In other words, the inspection pad PD may be an inspection pad for detecting a defective position of the sensing voltage line INITL. The inspection pad PD may be disposed to be adjacent to the first pixel part PX1. However, the position at which the inspection pad PD is disposed may be freely set as necessary.

Referring to FIG. 10, the inspection pad PD may be formed together with the sensing voltage line INITL, and may be disposed to be adjacent to the first pixel part PX1. In other words, the inspection pad PD may be formed or disposed on the same layer or a same layer as the sensing voltage line INITL, and may be electrically connected to the sensing voltage line INITL. A defective position of the sensing voltage line INITL may be detected through the inspection pad PD.

Referring to FIG. 11, in an embodiment, the inspection pad PD may be disposed on the same layer or a same layer as the first conductive pattern CP1. For example, the inspection pad PD may be disposed on the same layer or a same layer as the high power source voltage line VDDL, the low power source voltage line VSSL, the first data line DL1, and the sensing voltage line INITL.

Figure 12:
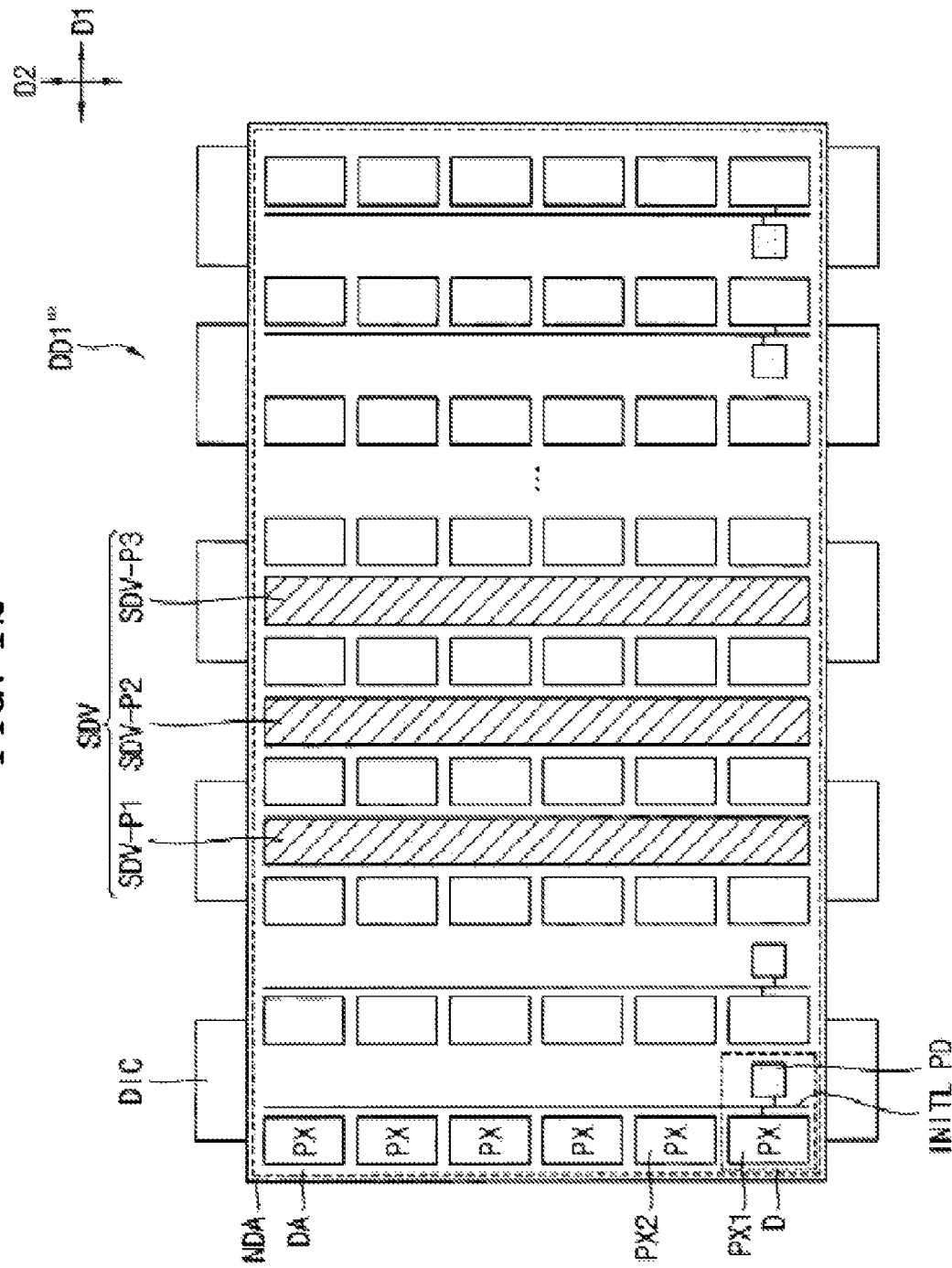
FIG. 12 illustrates a top plan view of a display device according to an embodiment.
Figure 13:
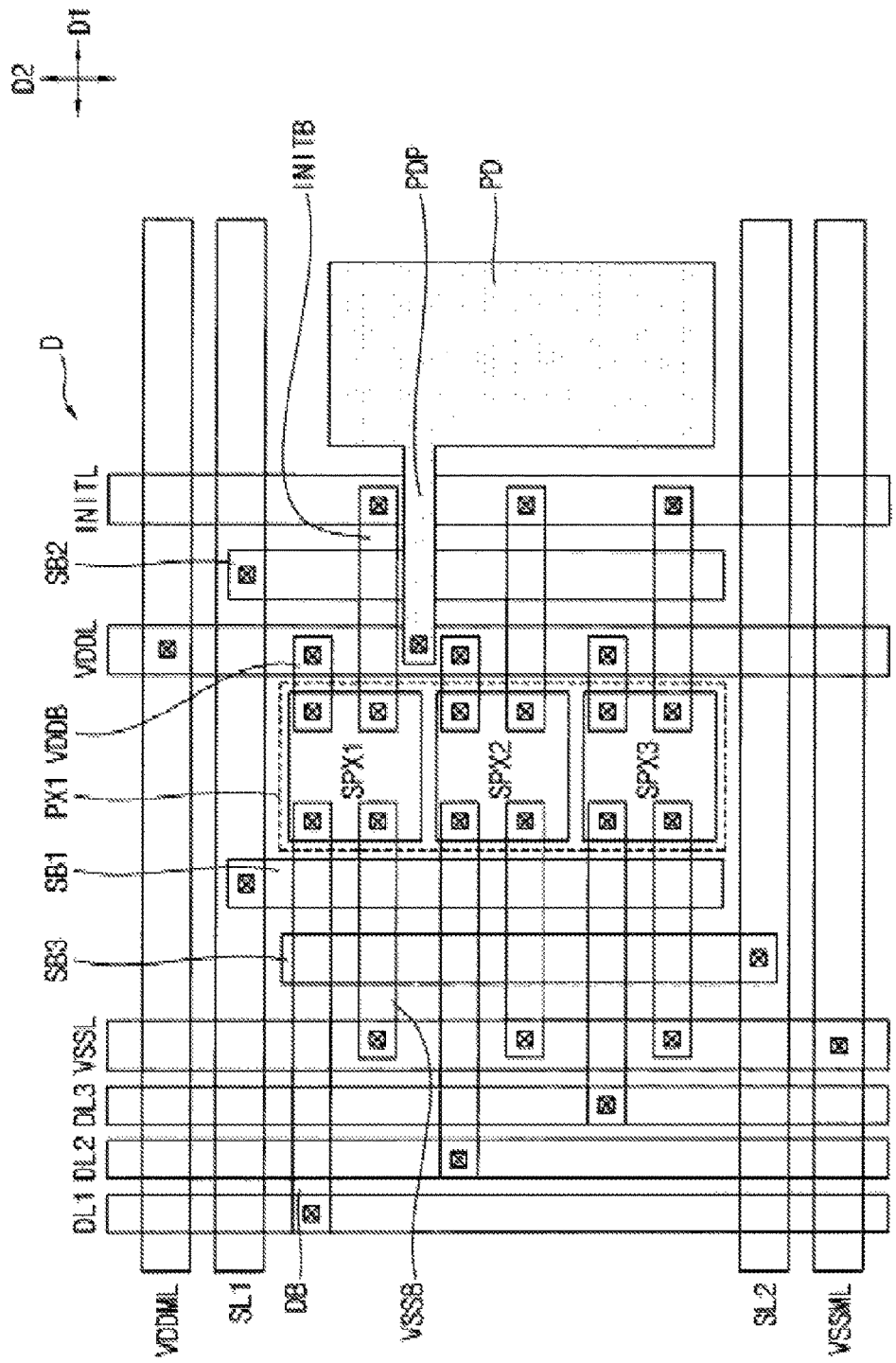
FIG. 13 illustrates an enlarged view of area "D" of FIG. 12.
Figure 14:
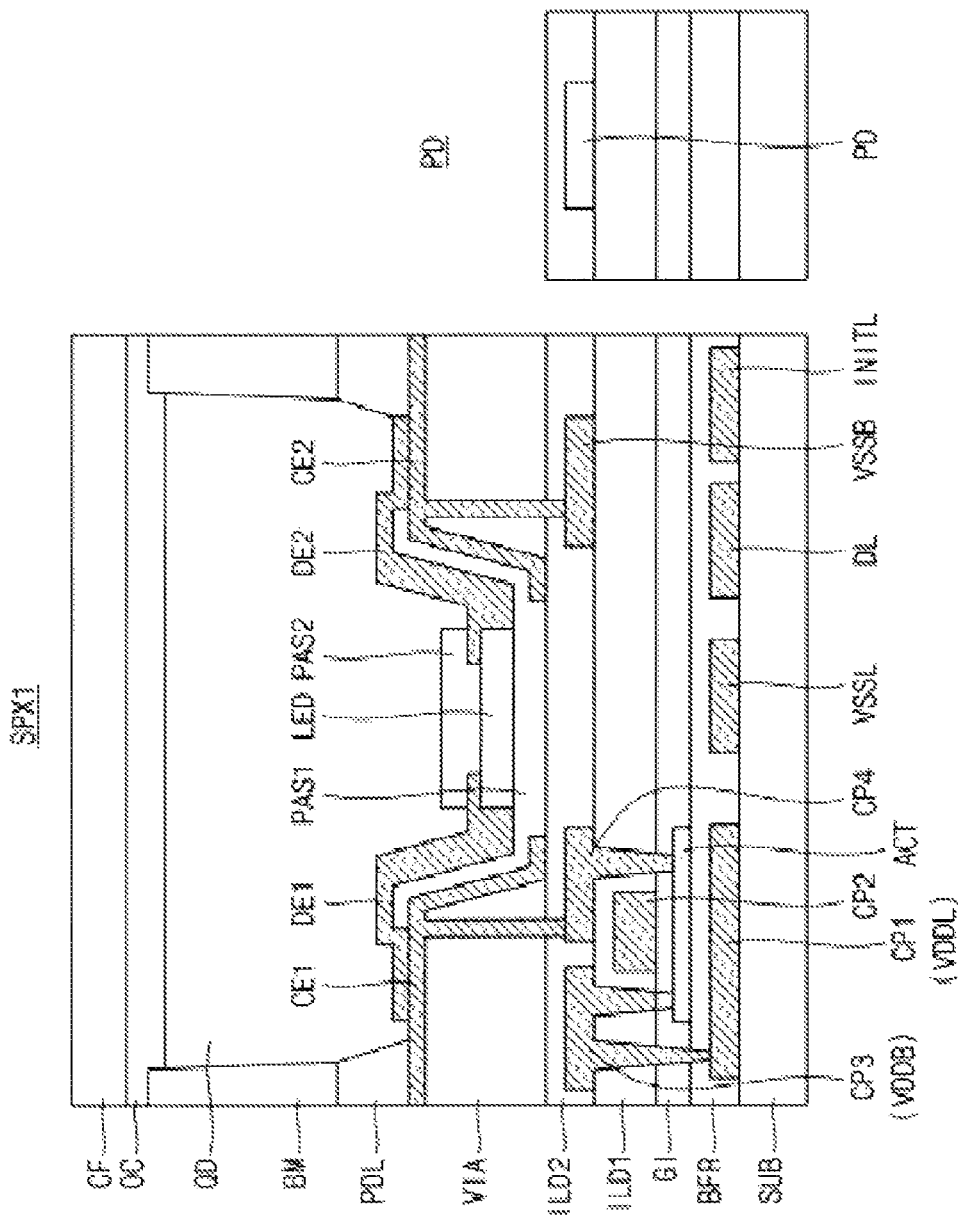
FIG. 14 illustrates a schematic cross-sectional view of the display device of FIG. 12.

FIG. 12 illustrates a top plan view of a display device according to an embodiment, FIG. 13 illustrates an enlarged view of area "D" of FIG. 12, and FIG. 14 illustrates a schematic cross-sectional view of the display device of FIG. 12.

Referring to FIG. 12, a first display device DD1'" according to an embodiment may be partitioned into the display area DA and the non-display area NDA. For example, a plurality of pixel parts PX, a scan driver SDV, and an inspection pad PD may be disposed in the display area DA. The non-display area NDA may be disposed to surround or to be adjacent to the display area DA. The non-display area NDA may be an area in which the pixel parts PX may not be disposed. For example, a plurality of data integrated circuits DIC may be disposed in the non-display area NDA. However, the scan driver SDV and the data integrated circuits DIC may be substantially the same as the scan driver SDV and the data integrated circuits DIC described above with reference to FIG. 2.

In an embodiment, as shown in FIG. 12, the pixel parts PX may include the first pixel part PX1 and the second pixel part PX2. For example, the first and second pixel parts PX1 and PX2 may be disposed in one pixel column or a pixel column. The first pixel part PX1 may be disposed in an outermost area of the display area DA adjacent to the non-display area NDA. The second pixel part PX2 may be spaced apart from the first pixel part PX1 in the second direction D2.

The first and second pixel parts PX1 and PX2 may be electrically connected to a second voltage line. In other words, the first and second pixel parts PX1 and PX2 may receive a second voltage from the second voltage line. The second voltage line may be an arbitrary voltage line that extends in the second direction D2 and transmits a voltage to the first and second pixel parts PX1 and PX2. In an embodiment, the second voltage line may be the high power source voltage line VDDL. However, the second voltage line is not limited thereto.

The inspection pad PD may be an inspection pad for performing an OS inspection. For example, the inspection pad PD may be a pad that a probe pin contacts.

The inspection pad PD may be electrically connected to the high power source voltage line VDDL. In other words, the inspection pad PD may be an inspection pad for detecting a defective position of the sensing voltage line VDDL. The inspection pad PD may be disposed to be adjacent to the first pixel part PX1. However, the position at which the inspection pad PD is disposed may be freely set as necessary.

Referring to FIG. 13, the sensing voltage line INITL may extend in the second direction D2, and may transmit the sensing voltage INIT. The high power source voltage line VDDL may extend in the second direction D2, and may transmit the high power source voltage VDD. The high power source voltage line VDDL may be disposed between the sensing voltage line INITL and the first pixel part PX1.

The inspection pad PD may include a protrusion PDP. The protrusion PDP may extend toward the high power source voltage line VDDL, and may be electrically connected to the high power source voltage line VDDL. The inspection pad PD may be electrically connected to the high power source voltage line VDDL through the protrusion PDP. In other words, the inspection pad PD may be an inspection pad for detecting a defective position of the high power source voltage line VDDL.

Referring to FIG. 14, in the embodiment, the inspection pad PD may be disposed on the same layer or a same layer as the third conductive pattern CP3. For example, the inspection pad PD may be disposed on the same layer or a same layer as the first scan line SL1, the second scan line SL2, the data bridge DB, the high power source voltage bridge VDDB, the low power source voltage bridge VSSB, and the sensing voltage bridge INITB. The sensing voltage line INITL and the second scan bridge SB2 may be disposed under or below the inspection pad PD.

The display devices DD1, DD1', DD1", and DD1'" according to embodiments may include the inspection pads PD, PD1, PD2, and PD3 disposed in the display area DA and the scan driver SDV disposed in the display area DA. For example, the inspection pad and the scan driver may be disposed between pixel columns. Accordingly, the non-display area surrounding or adjacent to the display area may be reduced. The inspection pad may be electrically connected to a line that transmits a signal and/or voltage. Accordingly, it is possible to detect a defective position of the line through the inspection pad.

The disclosure may be applied to a display device and an electronic device including the same. For example, the disclosure may be applied to a high resolution smart phone, a mobile phone, a smart pad, a smart watch, a tablet PC, a vehicle navigation system, a television, a computer monitor, a laptop computer, and the like within the spirit and the scope of the disclosure.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims and the disclosure.

What is claimed is:

1. A tiled display device comprising:
    a plurality of display devices bonded to each other,
    wherein a first display device of the plurality of display devices comprises:
    a display area and a non-display area adjacent to the display area;
    a first scan line that extends in a row direction and transmits a first scan signal;
    a first pixel part electrically connected to the first scan line;
    a second pixel part electrically connected to the first scan line and spaced apart from the first pixel part in the row direction;
    a first inspection pad disposed on one side of the second pixel part; and
    a second inspection pad disposed on the other side of the second pixel part,
    wherein a distance between the first pixel part and the second pixel part is greater than a distance between the first inspection pad and the second inspection pad.

2. The tiled display device of claim 1, wherein the first pixel part is disposed in a first outermost area of the display area adjacent to the non-display area.

3. The tiled display device of claim 1, wherein the first inspection pad is disposed between the first pixel part and the second pixel part.

4. The tiled display device of claim 3, further comprising:
    a third pixel part electrically connected to the first scan line and spaced apart from the second pixel part in the row direction;
    a fourth pixel part electrically connected to the first scan line and spaced apart from the third pixel part in the row direction; and
    a third inspection pad disposed between the third pixel part and the fourth pixel part.

5. The tiled display device of claim 4, wherein the fourth pixel part is disposed in a second outermost area of the display area adjacent to the non-display area and faces the first pixel part.

6. The tiled display device of claim 1, further comprising:
    a second scan line that extends in the row direction and transmits a second scan signal, and
    wherein the second inspection pad spaced apart from the first inspection pad in the row direction and electrically connected to the second scan line.

7. The tiled display device of claim 6, wherein the second pixel part is disposed between the first inspection pad and the second inspection pad.

8. The tiled display device of claim 1, wherein
    the first pixel part includes:
    a first conductive pattern disposed on a substrate;
    an active pattern disposed on the first conductive pattern;
    a second conductive pattern disposed on the active pattern; and
    a third conductive pattern disposed on the second conductive pattern and electrically connected to the first conductive pattern and the active pattern, and
    the first inspection pad and the third conductive pattern are disposed on a same layer.

9. The tiled display device of claim 8, further comprising:
    a data line that extends in a column direction intersecting the row direction and transmits a data voltage, the data line and the first conductive pattern are disposed on a same layer; and
    a data bridge that electrically connects the data line and the first pixel part, the data bridge and the third conductive pattern being disposed on a same layer.

10. The tiled display device of claim 8, further comprising:
    a sensing line that extends in a column direction intersecting the row direction and transmits a sensing voltage, the sensing line and the first conductive pattern being disposed on a same layer; and
    a sensing bridge that electrically connects the sensing line and the first pixel part, the sensing bridge and the third conductive pattern being disposed on a same layer.

11. The tiled display device of claim 8, further comprising:
    a high power source voltage line that extends in a column direction intersecting the row direction and transmits a high power source voltage, the high power source voltage line and the first conductive pattern being disposed on a same layer; and
    a high power source voltage bridge that electrically connects the high power source voltage line and the first pixel part, the high power source voltage bridge and the third conductive pattern being disposed on a same layer.

12. The tiled display device of claim 8, further comprising:
    a low power source voltage line that extends in a column direction intersecting the row direction and transmits a low power source voltage, the low power source voltage line and the first conductive pattern being disposed on a same layer; and
    a low power source voltage bridge that electrically connects the low power source voltage line and the first pixel part, the low power source voltage bridge and the third conductive pattern being disposed on a same layer.

13. The tiled display device of claim 8, wherein the first pixel part includes:
    a first connecting electrode disposed on the third conductive pattern;

a second connecting electrode disposed on the third conductive pattern and spaced apart from the first connecting electrode;

a nano light emitting element disposed on the first connecting electrode;

a first driving electrode disposed on the nano light emitting element and electrically contacting the first connecting electrode; and a second driving electrode that electrically contacts the second connecting electrode, the second driving electrode and the first driving electrode being disposed on a same layer.

14. The tiled display device of claim 13, wherein the first pixel part includes a color conversion pattern disposed on the nano light emitting element.

15. The tiled display device of claim 14, wherein the first pixel part includes a color filter disposed on the color conversion pattern.

16. A tiled display device comprising:

a plurality of display devices bonded to each other, wherein a first display device of the plurality of display devices comprises:

a display area and a non-display area adjacent to the display area;

a first voltage line that extends in a column direction and transmits a first voltage;

a first pixel part electrically connected to the first voltage line;

a second pixel part electrically connected to the first voltage line and spaced apart from the first pixel part in the column direction; and an inspection pad electrically connected to the first voltage line, wherein the inspection pad and a first conductive pattern are disposed on a same layer.

17. The tiled display device of claim 16, wherein the first pixel part includes:

the first conductive pattern disposed on a substrate;

an active pattern disposed on the first conductive pattern;

a second conductive pattern disposed on the active pattern; and a third conductive pattern disposed on the second conductive pattern and electrically connected to the first conductive pattern and the active pattern.

18. A tiled display device comprising:

a plurality of display devices bonded to each other, wherein a first display device of the plurality of display devices comprises:

a display area and a non-display area adjacent to the display area;

a first voltage line that extends in a column direction and transmits a first voltage;

a second voltage line that extends in the column direction and transmits a second voltage;

a first pixel part electrically connected to the first voltage line and the second voltage line;

a second pixel part electrically connected to the first voltage line and the second voltage line and spaced apart from the first pixel part in the column direction; and an inspection pad electrically connected to the second voltage line, and wherein the second voltage line is disposed between the first voltage line and the first pixel part, and wherein the inspection pad and a third conductive pattern are disposed on a same layer.

19. The tiled display device of claim 18, wherein the first pixel part includes:

a first conductive pattern disposed on a substrate;

an active pattern disposed on the first conductive pattern;

a second conductive pattern disposed on the active pattern; and the third conductive pattern disposed on the second conductive pattern and electrically connected to the first conductive pattern and the active pattern.

20. The tiled display device of claim 19, wherein the second voltage line and the first conductive pattern are disposed on a same layer.

* * * * *

UNITED STATES PATENT AND TRADEMARK OFFICE
CERTIFICATE OF CORRECTION

PATENT NO. : 11,942,028 B2
APPLICATION NO. : 18/097064
DATED : March 26, 2024
INVENTOR(S) : Dong Hee Shin, Sun Kwun Son and Na Hyeon Cha It is certified that error appears in the above-identified patent and that said Letters Patent is hereby corrected as shown below:

On the Title Page

Item (30) Foreign Application Priority Data should be corrected as follows:
Dec. 1, 2020 (KR)........................................10-2020-0166124

Signed and Sealed this
Thirtieth Day of April, 2024

Katherine Kelly Vidal
*Director of the United States Patent and Trademark Office*